United States Patent
Nakamura et al.

(10) Patent No.: US 8,268,731 B2
(45) Date of Patent: Sep. 18, 2012

(54) SEMICONDUCTOR DEVICE PRODUCING METHOD, SUBSTRATE PRODUCING METHOD AND SUBSTRATE PROCESSING APPARATUS

(75) Inventors: Naoto Nakamura, Toyama (JP); Iwao Nakamura, Imizu (JP); Ryota Sasajima, Toyama (JP)

(73) Assignee: Hitatchi Kokusai Electric Inc., Tokyo (JP)

( * ) Notice: Subject to any disclaimer, the term of this patent is extended or adjusted under 35 U.S.C. 154(b) by 718 days.

(21) Appl. No.: 11/887,347

(22) PCT Filed: Mar. 30, 2006

(86) PCT No.: PCT/JP2006/306722
§ 371 (c)(1),
(2), (4) Date: Aug. 6, 2009

(87) PCT Pub. No.: WO2006/106859
PCT Pub. Date: Oct. 12, 2006

(65) Prior Publication Data
US 2010/0029092 A1    Feb. 4, 2010

(30) Foreign Application Priority Data
Mar. 31, 2005    (JP) ................................ 2005-101275

(51) Int. Cl.
*H01L 21/31*    (2006.01)
(52) U.S. Cl. ........................ 438/770; 438/771; 438/787

(58) Field of Classification Search .................. 438/770, 438/771, 772, 774, 787, 788
See application file for complete search history.

(56) References Cited

U.S. PATENT DOCUMENTS
5,798,141 A * 8/1998 Harada ...................... 427/248.1

FOREIGN PATENT DOCUMENTS
| JP | 6-267938 A | 9/1994 |
| JP | 8-172084 A | 7/1996 |
| JP | 9-330128 A | 12/1997 |

* cited by examiner

*Primary Examiner* — Kevin M Picardat
(74) *Attorney, Agent, or Firm* — Birch, Stewart, Kolasch & Birch, LLP

(57) ABSTRACT

Disclosed is a producing method of a semiconductor device, including: loading a substrate into a reaction tube; oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain.

9 Claims, 7 Drawing Sheets

SEMICONDUCTOR DEVICE PRODUCING METHOD, SUBSTRATE PRODUCING METHOD AND SUBSTRATE PROCESSING APPARATUS

BACKGROUND OF THE INVENTION

1. Field of the Invention

The present invention relates to a producing method of a semiconductor device, a producing method of a substrate and a substrate processing apparatus, and more particularly, to a producing method of a semiconductor device having a step for oxidizing a semiconductor wafer, a producing method of a substrate having a step for oxidizing a substrate, and a substrate processing apparatus for oxidizing a semiconductor wafer.

2. Description of the Related Art

In an oxidation system for forming an oxide film on a wafer surface under a normal atmospheric pressure by heating a wafer by a heater and flowing an oxidizing gas such as oxygen, as a method for equalizing an oxygen partial pressure to oxidize so as to enhance the uniformity of batches of oxide films, there is a method in which a flow rate of an inert gas is changed in accordance with a variation of an atmospheric pressure to equalize an oxygen partial pressure (see Japanese Patent Application Publication Laid-open No. H8-172084).

According to this method, however, when a plurality of kinds of gases which react with each other for oxidizing, for example, when oxygen and hydrogen are used for oxidizing in a pyrogenic oxidizing, etc., or when oxygen and dichloroethylene ($C_2H_2Cl_2$: DCE) are used for oxidizing, it is not clear as to how a flow rate of the inert gas should be controlled, and if it is calculated from a flow rate of a gas or flow rates of gases which are to flow into a reaction chamber or an external combustion device, a total gas flow rate is varied if oxygen and hydrogen react with each other by the external combustion device as in the pyrogenic oxidizing. Therefore, there is a problem that a correction value is deviated and oxidizing can not be performed under a constant partial pressure of oxidizing gas or constant partial pressures of oxidizing gases.

SUMMARY OF THE INVENTION

Hence, it is a main object of the invention to provide a producing method of a semiconductor device, a producing method of a substrate and a substrate processing apparatus capable of processing a substrate while precisely controlling a partial pressure of an oxidizing gas or partial pressures of oxidizing gases even when an atmospheric pressure is varied when a plurality of kinds of gases which react with each other are used for oxidizing.

According to one aspect of the present invention, there is provided a producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant at partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain.

According to another aspect of the present invention, there is provided a producing method of a semiconductor device, comprising:

loading a substrate into a reaction tube;

supplying a processing gas or processing gases and an inert gas into the reaction tube to oxidize the substrate under an atmospheric pressure; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

According to another aspect of the present invention, there is provided a producing method of a substrate, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain.

According to another aspect of the present invention, there is provided a producing method of a substrate, comprising:

loading a substrate into a reaction tube;

oxidizing the substrate under an atmospheric pressure by supplying a processing gas or processing gases and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

According to another aspect of the present invention, there is provided a substrate processing apparatus, comprising:

a reaction tube to oxidize a substrate under an atmospheric pressure;

a first gas supply system to supply a first processing gas into the reaction tube;

a second gas supply system to supply a second processing gas which is to react with the first processing gas into the reaction tube;

a third gas supply system to supply an inert gas into the reaction tube;

a flow rate control device which is provided in at least the third gas supply system and which controls a flow rate of the inert gas to be supplied into the reaction tube;

a pressure gage, provided outside the reaction tube, to detect a variation of the atmospheric pressure; and a controller to control the flow rate of the inert gas to be supplied into the reaction tube such that the flow rate is varied to keep constant a partial pressure of an oxidizing gas or partial pressures of oxidizing gases in the reaction tube by the flow rate control device provided in the third gas supply system in accordance with a variation of the atmospheric pressure detected by the pressure gage when the substrate is oxidized, and the controller calculating the flow rate of the inert gas based on a pre-calculated flow rate of a gas or pre-calculated flow rates of gases produced by reaction between the first processing gas and the second processing gas and a pre-calculated flow rate of a gas which is not consumed by the reaction and which remains or pre-calculated flow rates of gases which are not consumed by the reaction and which remain.

According to another aspect of the present invention, there is provided a substrate processing apparatus, comprising:

a reaction tube to oxidize a substrate under an atmospheric pressure;

a processing gas supply system to supply a processing gas or processing gases into the reaction tube;

a first inert gas supply system to supply an inert gas into the reaction tube;

a second inert gas supply system to supply the inert gas into the reaction tube;

a first flow rate control device, provided in the first inert gas supply system, to control a flow rate of the inert gas to be supplied into the reaction tube;

a second flow rate control device, provided in the second inert gas supply system, to control a flow rate of the inert gas to be supplied into the reaction tube, the second flow rate control device having a full scale different from that of the first flow rate control device;

a pressure gage, provided outside the reaction tube, to detect a variation of the atmospheric pressure; and a controller to control a flow rate of the inert gas to be supplied into the reaction tube such that the flow rate is varied to keep constant a partial pressure of an oxidizing gas or partial pressures of oxidizing gases in the reaction tube in accordance with a variation of the atmospheric pressure detected by the pressure gage when the substrate is oxidized, the controller controlling the flow rate of the inert gas to keep the flow rate constant in the second flow rate control device and the flow rate of the inert gas to vary the flow rate in accordance with the variation of the atmospheric pressure in the first flow rate control device.

DESCRIPTION OF THE PREFERRED EMBODIMENTS

Figure 1:
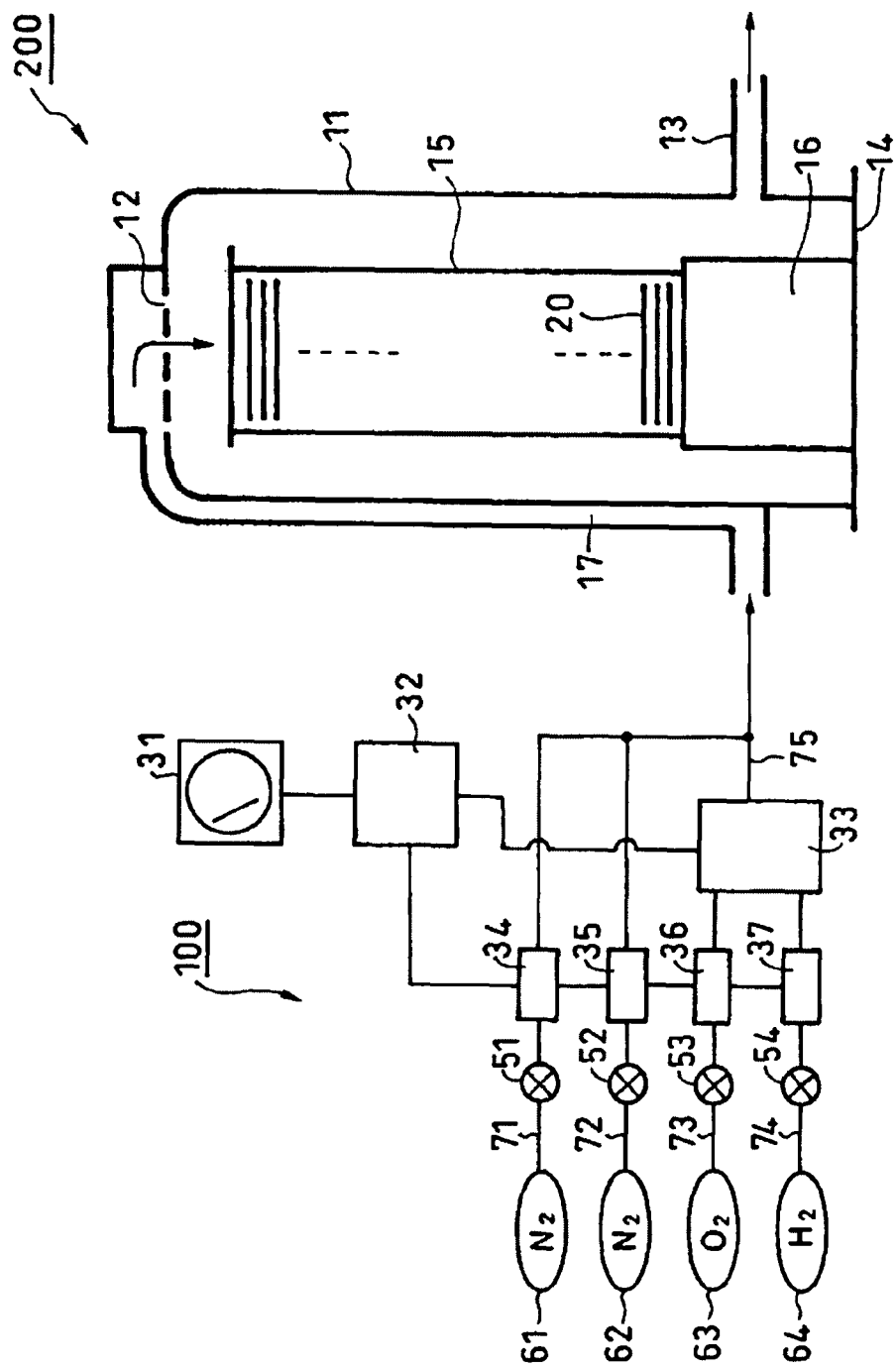
FIG. 1 is a schematic vertical sectional view for explaining a substrate processing apparatus of an embodiment 1 of the present invention.

Preferred embodiments of the present invention provide a producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain.

With this, when oxidizing is carried out using the plurality of kinds of gases which react with each other, even when the atmospheric pressure is varied, the substrate can be processed while precisely controlling the partial pressure of the oxidizing gas or the oxidizing gases.

In order to employ absolute pressure control, sealing performance of a furnace must be enhanced, the furnace must have such a structure that evacuation can be carried out, and it is necessary to newly provide a vacuum control system and the like, and such requirements increase costs. In the case of the present invention, since the absolute pressure control can be achieved only by changing the software for controlling the flow rate, and it is unnecessary to meet the above-described requirements and therefore the cost performance of the present invention is excellent.

Preferably, the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

The flow rate of the inert gas is changed in accordance with the variation of the atmospheric pressure using the flow rate controller having a small full scale, and a correction against the variation of the atmospheric pressure is carried out. With this, it is possible to secure necessary resolving power and to secure precision in control.

Preferably, the flow rate of the inert gas is controlled by a plurality of flow rate control devices having different full scales to supply the inert gas into the reaction tube, at least one of the flow rate control devices controls a flow rate of the inert gas such that the flow rate is kept constant, and a flow rate control device having the smallest full scale controls a flow rate of the inert gas such that the flow rate is varied in accordance with the variation of the atmospheric pressure.

Preferably, the flow rate of the inert gas is controlled by two flow rate control devices having different full scales to supply the inert gas into the reaction tube, one of the two flow rate control devices having a greater full scale controls a flow rate of the inert gas such that the flow rate is kept constant, and the other of the two flow rate control devices having a smaller full scale controls a flow rate of the inert gas such that the flow rate is varied in accordance with the variation of the atmospheric pressure.

Preferably, the flow rate of the inert gas is controlled by a plurality of flow rate control devices to supply the inert gas into the reaction tube, at least one of the flow rate control devices controls a flow rate of the inert gas such that the flow rate is kept constant, and at least another of the flow rate control devices controls a flow rate of the inert gas such that the flow rate is varied in accordance with the variation of the atmospheric pressure.

Preferably, the plurality of kinds of gases which react with each other are $O_2$ gas and $H_2$ gas, and these gases are supplied directly into the reaction tube or supplied into the reaction tube through an external combustion device provided outside the reaction tube.

Preferably, the plurality of kinds of gases which react with each other are $O_2$ gas and $C_2H_2Cl_2$ gas, and these gases are supplied directly into the reaction tube.

Preferred embodiments of the present invention provide a producing method of a semiconductor device, comprising:

loading a substrate into a reaction tube;

supplying a processing gas or processing gases and an inert gas into the reaction tube to oxidize the substrate under an atmospheric pressure; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

Preferred embodiments of the present invention provide a producing method of a substrate, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain.

Preferred embodiments of the present invention provide a producing method of a substrate, comprising:

loading a substrate into a reaction tube;

oxidizing the substrate under an atmospheric pressure by supplying a processing gas or processing gases and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

Preferred embodiments of the present invention provide a substrate processing apparatus, comprising:

a reaction tube to oxidize a substrate under an atmospheric pressure;

a first gas supply system to supply a first processing gas into the reaction tube;

a second gas supply system to supply a second processing gas which is to react with the first processing gas into the reaction tube;

a third gas supply system to supply an inert gas into the reaction tube;

a flow rate control device which is provided in at least the third gas supply system and which controls a flow rate of the inert gas to be supplied into the reaction tube;

a pressure gage, provided outside the reaction tube, to detect a variation of the atmospheric pressure; and a controller to control the flow rate of the inert gas to be supplied into the reaction tube such that the flow rate is varied to keep constant a partial pressure of an oxidizing gas or partial pressures of oxidizing gases in the reaction tube by the flow rate control device provided in the third gas supply system in accordance with a variation of the atmospheric pressure detected by the pressure gage when the substrate is oxidized, and the controller calculating the flow rate of the inert gas based on a pre-calculated flow rate of a gas or pre-calculated flow rates of gases produced by reaction between the first processing gas and the second processing gas and a pre-calculated flow rate of a gas which is not consumed by the reaction and which remains or pre-calculated flow rates of gases which are not consumed by the reaction and which remain.

Preferred embodiments of the present invention provide a substrate processing apparatus, comprising:

a reaction tube to oxidize a substrate under an atmospheric pressure;

a processing gas supply system to supply a processing gas or processing gases into the reaction tube;

a first inert gas supply system to supply an inert gas into the reaction tube;

a second inert gas supply system to supply the inert gas into the reaction tube;

a first flow rate control device, provided in the first inert gas supply system, to control a flow rate of the inert gas to be supplied into the reaction tube;

a second flow rate control device, provided in the second inert gas supply system, to control a flow rate of the inert gas to be supplied into the reaction tube, the second flow rate control device having a full scale different from that of the first flow rate control device;

a pressure gage, provided outside the reaction tube, to detect a variation of the atmospheric pressure; and a controller to control a flow rate of the inert gas to be supplied into the reaction tube such that the flow rate is varied to keep constant a partial pressure of an oxidizing gas or partial pressures of oxidizing gases in the reaction tube in accordance with a variation of the atmospheric pressure detected by the pressure gage when the substrate is oxidized, the controller controlling the flow rate of the inert gas to keep the flow rate constant in the second flow rate control device and the flow rate of the inert gas to vary the flow rate in accordance with the variation of the atmospheric pressure in the first flow rate control device.

Preferred embodiments of the present invention provide a method for processing a substrate using an oxidation system of a normal atmospheric pressure which heats the substrate such as a semiconductor wafer by heating means such as a heater, and which flows an oxidizing gas or oxidizing gases to form an oxide film on a surface of the substrate, in which when a plurality of kinds of gases which react with each other in an external combustion device or a reaction tube, a flow rate of a gas or flow rates of gases produced after the reaction and a flow rate of a remaining gas or flow rates of remaining gases are calculated, a flow rate of an inert gas corresponding to a variation of an atmospheric pressure is calculated based on these flow rates, the flow rate of the inert gas is varied in accordance with the atmospheric pressure based on the calculated value, and a partial pressure of the oxidizing gas or partial pressures of the oxidizing gases are controlled constant to process the substrate. Reproducibility of batches of the oxide films can be enhanced. Preferably, gases which react with each other are oxygen and hydrogen. Preferably, gases which react with each other are oxygen and dichloroethylene.

The preferred embodiments of the present invention provide a method for processing a substrate using an oxidation system of a normal atmospheric pressure which heats the substrate such as a semiconductor wafer by heating means such as a heater, and which flows an oxidizing gas or oxidizing gases to form an oxide film on a surface of the substrate, in which a plurality of flow rate control devices for an inert gas having different full scales are provided, the oxidizing gas or the oxidizing gases and an inert gas flow at the same time, a flow rate of the inert gas is changed by a flow rate control device having a smaller full scale in accordance with a variation of an atmospheric pressure, and a partial pressure of the oxidizing gas or partial pressures of the oxidizing gases are controlled constant to process the substrate.

If the partial pressure of the oxidizing gas or the partial pressures of the oxidizing gases are made constant for oxidizing, it is possible to enhance the uniformity of batches of oxide films. At that time, if correction is made against a variation of the atmospheric pressure by the flow rate control device having the smaller full scale, it is possible to secure necessary resolving power and to secure precision of control.

The preferred embodiments of the present invention provide a method for processing a substrate using an oxidation system of a normal atmospheric pressure which heats the substrate such as a semiconductor wafer by heating means such as a heater, and which flows an oxidizing gas or oxidizing gases to form an oxide film on a surface of the substrate, in which the flow rate control device for an inert gas has a flow rate greater than the maximum flow rate required for correction with respect to the atmospheric pressure and a full scale closest to the maximum flow rate, the oxidizing gas or the oxidizing gases and the inert gas flow at the same time, a flow rate of the inert gas is changed by the flow rate control device in accordance with a variation of the atmospheric pressure, and a partial pressure of the oxidizing gas or partial pressures of the oxidizing gases are controlled constant to process the substrate.

If the partial pressure of the oxidizing gas or the partial pressures of the oxidizing gases are made constant for oxidizing, it is possible to enhance the uniformity of batches of oxide films. At that time, the flow rate control device for the inert gas has a flow rate greater than the maximum flow rate required for correction with respect to the atmospheric pressure and a full scale closest to the maximum flow rate, and correction is carried out against the variation of the atmospheric pressure by such as flow rate control device. With this, it is possible to secure necessary resolving power and to secure precision of control.

The preferred embodiments of the present invention provide a method for processing a substrate using an oxidation system of a normal atmospheric pressure which heats the substrate such as a semiconductor wafer by heating means such as a heater, and which flows an oxidizing gas or oxidizing gases to form an oxide film on a surface of the substrate, in which the oxidizing gas or the oxidizing gases and an inert gas flow at the same time using a flow rate control device of the inert gas having a smaller full scale than a flow rate of the oxidizing gas or flow rates of the oxidizing gases, a flow rate of the inert gas is changed by the flow rate control device in accordance with a variation in the atmospheric pressure, and a partial pressure of the oxidizing gas or partial pressures of the oxidizing gases are controlled constant to process the substrate.

If the partial pressure of the oxidizing gas or the partial pressures of the oxidizing gases are made constant for oxidizing, it is possible to enhance the uniformity of batches of oxide films. At that time, correction is carried out against the variation of the atmospheric pressure by the flow rate control device of the inert gas having a smaller full scale than the flow rate of the oxidizing gas or the flow rates of the oxidizing gases. With this, it is possible to secure necessary resolving power and to secure precision of control.

In the preferred embodiments of the present invention, when gases which react with each other such as oxygen and hydrogen are used, a flow rate to be introduced is not used for calculation as it is, a flow rate of a gas or flow rates of gases produced as a result of the reaction and a flow rate of remaining gas or flow rates of remaining gases are calculated, and a flow rate of an inert gas to be supplied for correcting such that a partial pressure of an oxidizing gas or partial pressures of oxidizing gases become constant is calculated based on these flow rates, and oxidizing is carried out under a condition that the partial pressure of the oxidizing gas or the partial pressures of the oxidizing gases are constant.

To eliminate a variation of the partial pressure of the oxidizing gas or the partial pressures of the oxidizing gases caused by a variation of an atmospheric pressure, a flow rate of a gas or flow rates of gases after reaction are calculated from a flow rate of a gas or flow rates of gases which flow into the reaction chamber or the external combustion device, and the flow rate of the inert gas which flows such that the partial pressure of the oxidizing gas or the partial pressures of the oxidizing gases become constant is calculated using the flow rate or the flow rates after the reaction. With this, the precision of the inert gas for correction against the variation of the atmospheric pressure is enhanced. As a result, the partial pressure of the oxidizing gas or the partial pressures of the oxidizing gases in the reaction chamber can be controlled more precisely and more constant, and reproducibility of thickness of oxide films between batches can be enhanced.

Since the reproducibility between batches of oxide film thicknesses is enhanced, characteristics of semiconductor devices and substrates produced using the oxidation system become more stable, yield and quality are enhanced.

In the preferred embodiments of the present invention, in order to make constant a partial pressure of an oxidizing gas or partial pressures of oxidizing gases caused by a variation of an atmospheric pressure, a plurality of flow rate control devices for an inert gas having different full scales (controllable maximum flow rates) are provided, and a correction against the variation of the atmospheric pressure is carried out by a flow rate control device having a smaller full scale, thereby securing the necessary resolving power, securing control precision, and enhancing the reproducibility of oxide film thickness between batches. By using a flow rate control device for the inert gas having a smaller full scale than a flow rate of an oxidizing gas or flow rates of oxidizing gases, necessary resolving power is secured, precision of control is secured, and reproducibility of oxide film thickness between batches is enhanced. Examples of the inert gas supplied for correction against the variation of the atmospheric pressure are $N_2$, Ar and He.

If the reproducibility of oxide film thickness between batches is enhanced, characteristics of semiconductor devices and substrates produced using the oxidation system become more stable, yield and quality are enhanced.

Next, preferable embodiments of the present invention will be explained with reference to the drawings.

[Embodiment 1]

FIG. 1 is a schematic vertical sectional view for explaining a substrate processing apparatus of an embodiment 1 of the present invention. The substrate processing apparatus includes a reaction furnace 200 and a gas supply system 100 for supplying gas to the reaction furnace 200.

In the reaction furnace 200, a boat 15 as a supporting tool is brought into a reaction tube 11. Wafers 20 as substrates are stacked on one another in multi-layers in horizontal attitudes. A lower end opening of the reaction tube 11 is air-tightly closed with a furnace opening lid 14, and the boat 15 stands on the furnace opening lid 14 through a boat mounting stage 16. Gas introduction ports 12 comprising a plurality of through holes are formed in a ceiling surface of the reaction tube 11. A gas introduction tube 17 is in communication with the gas introduction ports 12, and an exhaust tube 13 is in communication with a lower end of a sidewall of the reaction tube 11. A heater 19 as a heating mechanism is provided outside of the reaction tube 11.

The gas supply system 100 is connected to the gas introduction tube 17. The gas supply system 100 includes a pressure gage 31, a controller 32, an external combustion device 33 as a moisture generating device, an oxidizing gas partial pressure correcting nitrogen gas supply line 71 as a first inert gas supply system, a dilution/purge nitrogen gas supply line 72 as a second inert gas supply system, an oxygen gas supply line 73 as a first processing gas supply system, and a hydrogen gas supply line 74 as a second processing gas supply system.

The oxidizing gas partial pressure correcting nitrogen gas supply line 71 includes a nitrogen gas source 61, a valve 51 and a mass flow controller 34 as a flow rate control device. The dilution/purge nitrogen gas supply line 72 includes a nitrogen gas source 62, a valve 52 and a mass flow controller 35. The oxygen gas supply line 73 includes an oxygen gas source 63, a valve 53 and a mass flow controller 36. The hydrogen gas supply line 74 includes a hydrogen gas source 64, a valve 54 and a mass flow controller 37. The oxygen gas supply line 73 and the hydrogen gas supply line 74 are connected to the external combustion device 33. The gas line 75 downstream of the external combustion device 33, the oxidizing gas partial pressure correcting nitrogen gas supply line 71 and the dilution/purge nitrogen gas supply line 72 are merged into one line and are connected to the gas introduction tube 17.

In this embodiment, pyrogenic oxidizing is carried out, oxygen gas ($O_2$) and hydrogen gas ($H_2$) are combustion reacted with each other by the external combustion device 33 to generate water vapor ($H_2O$), and oxidizing is carried out by this water vapor and oxygen which is not consumed by the combustion reaction. In this case, since $2H_2+O_2 \rightarrow 2H_2O$, the oxidizing gases are water vapor ($H_2O$) generated by the combustion and oxygen which was not consumed by the combustion reaction.

The controller 32 is connected to the atmospheric pressure gage 31, the mass flow controllers 34 to 37 as the flow rate control devices and the external combustion device 33. The controller 32 controls the mass flow controllers 35 to 37 and the external combustion device 33, and controls the mass flow controller 34 in accordance with a value of the pressure gage 31.

[Embodiment 2]

Figure 2:
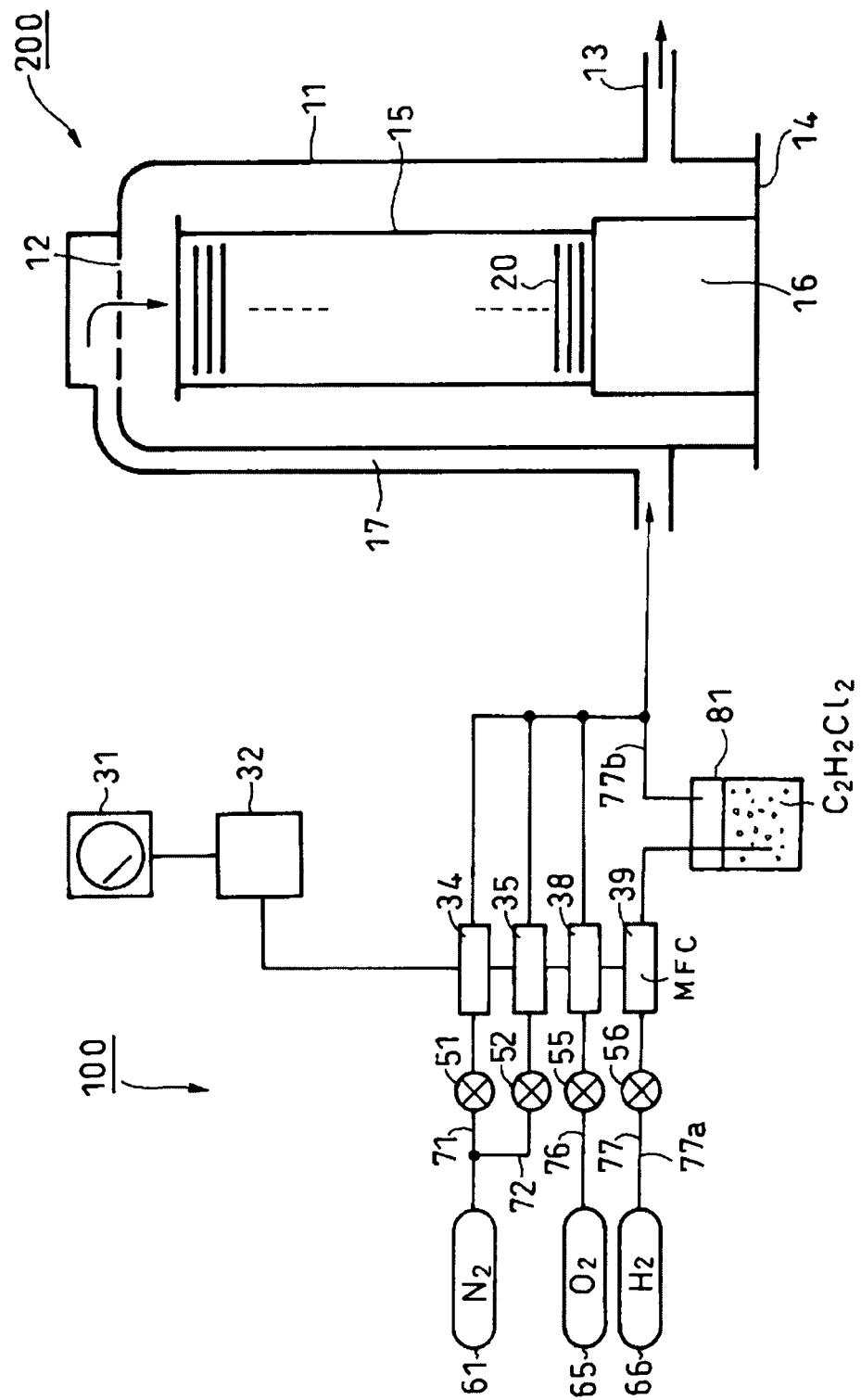
FIG. 2 is a schematic vertical sectional view for explaining a substrate processing apparatus of an embodiment 2 of the invention.

FIG. 2 is a schematic vertical sectional view for explaining a substrate processing apparatus of an embodiment 2 of the invention. This substrate processing apparatus includes a reaction furnace 200 and a gas supply system 100 for supplying gas to the reaction furnace 200. The reaction furnace 200 is the same as the reaction furnace 200 of the embodiment 1 explained with reference to FIG. 1.

The gas supply system 100 is connected to the gas introduction tube 17. The gas supply system 100 includes a pressure gage 31, a controller 32, an oxidizing gas partial pressure correcting nitrogen gas supply line 71 as a first inert gas supply system, a dilution/purge nitrogen gas supply line 72 as a second inert gas supply system, an oxygen gas supply line 76 as a first processing gas supply system and a dichloroethylene gas supply line 77 as a second processing gas supply system.

The oxidizing gas partial pressure correcting nitrogen gas supply line 71 includes a nitrogen gas source 61, a valve 51 and a mass flow controller 34. The dilution/purge nitrogen gas supply line 72 includes a nitrogen gas source 61, a valve 52 and a mass flow controller 35. In this embodiment, the nitrogen gas source 61 is common for the oxidizing gas partial pressure correcting nitrogen gas supply line 71 and the dilution/purge nitrogen gas supply line 72. The oxygen gas supply line 76 includes an oxygen gas source 65, a valve 55 and a mass flow controller 38. The dichloroethylene gas supply line 77 includes a bubbling nitrogen gas supply line 77a, a bubbler 81 and a dichloroethylene gas supply line 77b obtained by bubbling. The bubbling nitrogen gas supply line 77a includes a nitrogen gas source 66, a valve 56 and a mass flow controller 39. The dichloroethylene is liquid at a normal temperature and under a normal pressure and thus, the dichloroethylene is accommodated in the bubbler 81, and is supplied together with nitrogen gas by bubbling by the nitrogen gas.

The oxidizing gas partial pressure correcting nitrogen gas supply line 71, the dilution/purge nitrogen gas supply line 72, the oxygen gas supply line 76 and the dichloroethylene gas supply line 77 are merged into one line and connected to the gas introduction tube 17. In this embodiment, oxidizing is carried out using oxygen gas ($O_2$) and dichloroethylene gas ($C_2H_2Cl_2$), and oxidizing gas and dichloroethylene are supplied to the reaction furnace 200 directly. In this case, since $C_2H_2Cl_2 + 2O_2 \rightarrow 2CO_2 + 2HCl$, oxidizing gases are carbon dioxide ($CO_2$) generated by reaction and oxygen ($O_2$) which was not consumed by the reaction.

The controller 32 is connected to the pressure gage 31 and the mass flow controllers 34, 35, 38 and 39. The controller 32 controls the mass flow controllers 35, 38 and 39, and controls the mass flow controller 34 in accordance with a value of the pressure gage 31.

[Embodiment 3]

Figure 3:
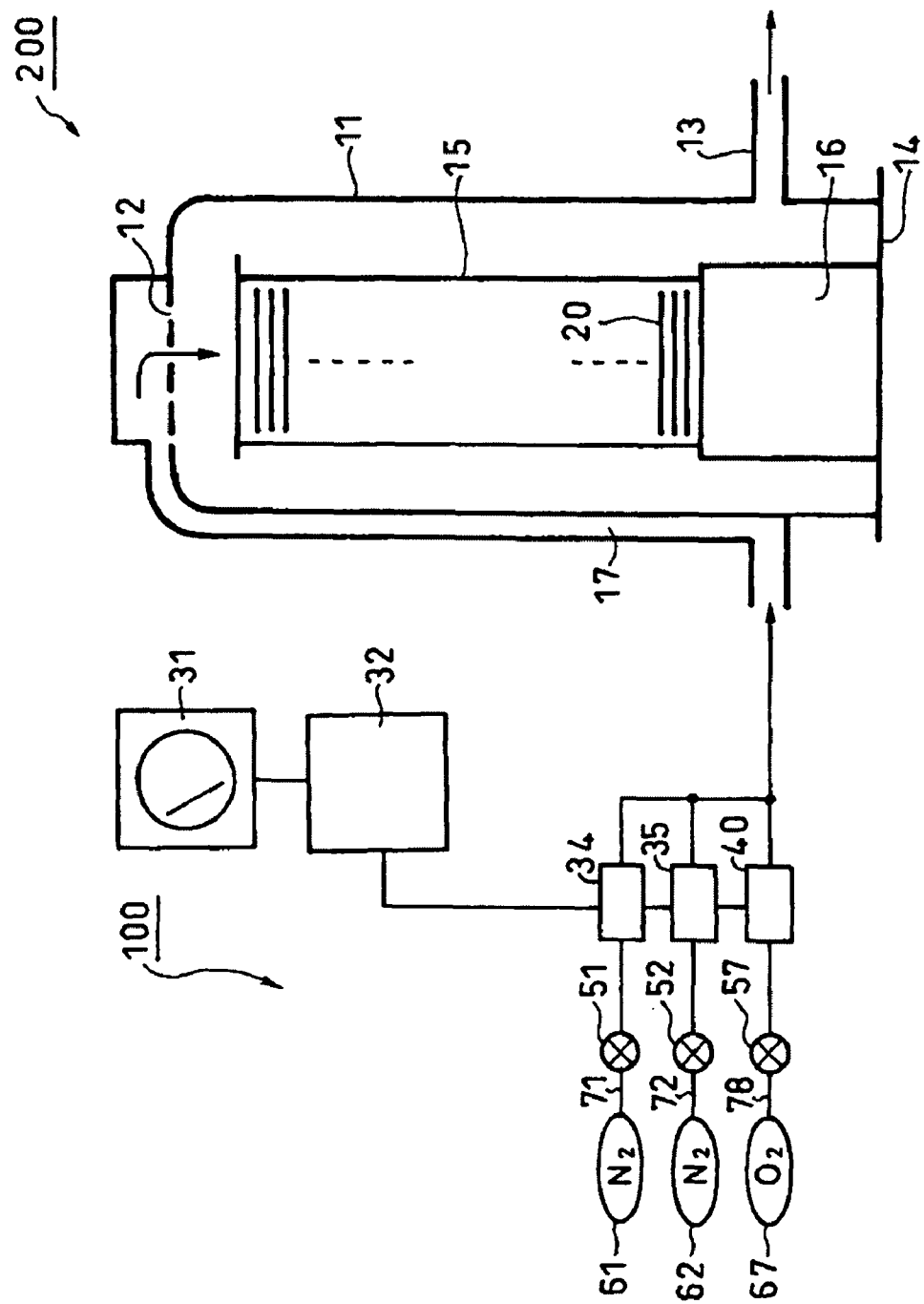
FIG. 3 is a schematic vertical sectional view for explaining a substrate processing apparatus of an embodiment 3 of the invention.

FIG. 3 is a schematic vertical sectional view for explaining a substrate processing apparatus of an embodiment 3 of the invention. This substrate processing apparatus includes a reaction furnace 200 and a gas supply system 100 for supplying gas to the reaction furnace 200. The reaction furnace 200 is the same as the reaction furnace 200 of the embodiment 1 explained with reference to FIG. 1.

The gas supply system 100 is connected to the gas introduction tube 17. The gas supply system 100 includes a pressure gage 31, a controller 32, an oxidizing gas partial pressure correcting nitrogen gas supply line 71 as a first inert gas supply system, a dilution/purge nitrogen gas supply line 72 as a second inert gas supply system, and an oxygen gas supply line 78 as a processing gas supply system.

The oxidizing gas partial pressure correcting nitrogen gas supply line 71 includes a nitrogen gas source 61, a valve 51 and a mass flow controller 34. The dilution/purge nitrogen gas supply line 72 includes a nitrogen gas source 62, a valve 52 and a mass flow controller 35. The oxygen gas supply line 78 includes an oxygen gas source 67, a valve 57 and a mass flow controller 40.

The oxidizing gas partial pressure correcting nitrogen gas supply line 71, the dilution/purge nitrogen gas supply line 72 and the oxygen gas supply line 78 are merged into one line and connected to the gas introduction tube 17. In this embodiment, dry oxidizing is carried out by oxidizing gas.

The controller 32 is connected to the pressure gage 31 and the mass flow controllers 34, 35 and 40. The controller 32 controls the mass flow controllers 35 and 40, and controls the mass flow controller 34 in accordance with a value of the pressure gage 31.

It is preferable that the pressure gage 31 used in each of the embodiments 1 to 3 has a signal output resolving power of minimum 1 hPa. This is because that in order to set film thickness variation caused by variation in atmospheric pressure in a range of ±0.1%, since a normal atmospheric pressure is 1000 hPa, at least 1/1000 of signal output resolving power is necessary. It is preferable that the pressure gage 31 has a signal output resolving power of 0.1 hPa and in this case, the film thickness variation can be 0.01%.

In the embodiments 1 to 3, two supply lines, i.e., the oxidizing gas partial pressure correcting nitrogen gas supply line 71 and the dilution/purge nitrogen gas supply line 72 are provided as supply lines for nitrogen gas which is the inert gas. A full scale of the mass flow controller 34 used for the oxidizing gas partial pressure correcting nitrogen gas supply line 71 and a full scale of the mass flow controller 35 used for the dilution/purge nitrogen gas supply line 72 are different from each other. The mass flow controller 35 used for the dilution/purge nitrogen gas supply line 72 uses one of the controllers having a greater full scale.

When a flow rate of inert gas is varied in accordance with variation in atmospheric pressure, since the mass flow controller as a gas flow rate control device which is usually used has resolving power of 1/1000 full scale, if the mass flow controller is used with 1/5 of the full scale, only resolving power of 1/200 is obtained, and there is a problem that variation in atmospheric pressure can not sufficiently be handled.

Hence, the oxidizing gas partial pressure correcting nitrogen gas supply line 71 is provided, full scale of the mass flow controller 34 used for the supply line is made smaller than full scale of the mass flow controller 35 used for the dilution/purge nitrogen gas supply line 72, a flow rate of nitrogen gas with respect to the atmospheric pressure is carried out by the mass flow controller 34, thereby securing necessary resolving power and securing precision of control.

The full scale of the mass flow controller 34 is greater than the maximum flow rate required for correcting the atmospheric pressure and is the closest to this maximum flow rate. The full scale of the mass flow controller 34 is smaller than that of the flow rate of oxidizing gas. For example, in the embodiment 1, if full scales of the mass flow controllers 35 to 37 are set in a range of 20 l/min to 50 l/min and a flow rate required for correcting the atmospheric pressure is 1 to 9 l/min, the full scale of the mass flow controller 34 is set in a range of 2 l/min to 5 l/min.

Taking a range of generally varying atmospheric pressure range into account, a pressure to be corrected by the mass flow controller 34 is set in a range of 950 to 1030 hPa on a plain (average atmospheric pressure is 1013 hPa), in a range of 880 to 960 hPa at elevations of 500 m (average atmospheric pressure is 944 hPa) at elevation of 500 m, and in a range of 828 to 898 hPa at elevations of 1000 m (average atmospheric pressure is 883 hPa).

The resolving power of the mass flow controller is 1/1000 of the full scale, and a flow rate of nitrogen gas to be controlled by the correcting mass flow controller 34 is about 1/10 of the total flow rate. Therefore, when a mass flow controller having a full scale of about 1/10 of the total flow rate is used as the correcting mass flow controller 34, there is resolving power of 1/10000, and this is greater than resolving power of the pressure gage. Therefore, when it is possible to control resolving power degree of the pressure gage and the pressure gage has output resolving power of 0.1 hPa, a film thickness variation by the atmospheric pressure can theoretically be suppressed to about ±0.01%, and it is assumed that a film thickness variation by the atmospheric pressure can be negligible in view of reproducibility of other devices.

In the embodiments 1 to 3, when the wafer 20 is oxidized, the flow rate of nitrogen gas which is inert gas to be supplied to the reaction furnace 200 from the dilution/purge nitrogen gas supply line 72 is kept constant by controlling the mass flow controller 35, the mass flow controller 34 is controlled in accordance with variation in atmospheric pressure detected by the pressure gage 31, thereby varying a flow rate of nitrogen gas which is inert gas to be supplied into the reaction furnace 200 from the oxidizing gas partial pressure correcting nitrogen gas supply line 71, and the partial pressure of oxidizing gas is kept constant.

In the embodiment 1, the flow rate of correcting nitrogen gas is calculated by the controller 32 based on a pre-calculated flow rate of gas (water vapor: $H_2O$) produced by reaction between oxygen gas and hydrogen gas and a flow rate of gas (oxygen: $O_2$) which is not consumed by the reaction and remains, and the mass flow controller 34 is controlled.

In the embodiment 2, a flow rate of correcting nitrogen gas is calculated by the controller 32 based on a pre-calculated flow rate of gas (carbon dioxide: $CO_2$) produced by reaction between oxygen gas and dichloroethylene (DCE) gas and a flow rate of gas (oxygen: $O_2$) which is not consumed by the reaction and remains, and the mass flow controller 34 is controlled.

That is, the actual flow rate that is a total flow rate of gases after reaction is calculated from a control flow rate which is a total flow rate of gases before they are introduced into the reaction furnace 200 and before reaction.

In the case of the embodiment 1 in which oxygen gas and hydrogen gas flow, if a flow rate of the hydrogen gas ($H_2$) to be supplied to the reaction furnace 200 is defined as A and a flow rate of oxygen gas ($O_2$) is defined as B, since $2H_2+O_2 \rightarrow 2H_2O$, if there is sufficient oxygen gas, oxygen gas A/2 reacts with hydrogen gas A, water vapor ($H_2O$) is produced only by A, and oxygen gas of (B−A/2) is not consumed and remains. That is, the actual flow rate R that is a total flow rate of gases after reaction can be obtained by the following equation: R=A (produced $H_2O$)+(B−A/2) (remaining $O_2$ which is not consumed)=B+A/2. If dilution gas flows together with oxygen gas and hydrogen gas when the wafer 200 is oxidized, and if the flow rate of dilution gas is defined as C, the actual flow rate R can be obtained by the following equation: R=B+A/2+C.

In the case of the embodiment 2 in which oxygen gas and DCE gas flow, if a flow rate of dichloroethylene gas ($C_2H_2Cl_2$) supplied into the reaction furnace 200 is defined as A and a flow rate of oxygen gas ($O_2$) is defined as B, since $C_2H_2Cl_2+2O_2 \rightarrow 2CO_2+2HCl$, if there is sufficient oxygen gas, oxidizing gas 2A reacts with the dichloroethylene gas A, carbon dioxide ($CO_2$) is produced by 2A and hydrogen chloride (HCl) is produced by 2A, oxygen of B−2A is not consumed and remains. That is, the actual flow rate R that is a total flow rate of gases after reaction can be obtained by the following equation: R=2A (produced $CO_2$)+2A (produced HCl)+(B−2A) ($O_2$ which is not consumed and remains). If dilution gas flows together with oxygen gas and DCE gas when a wafer 200 is oxidized, if a flow rate of dilution gas is defined as C, the actual flow rate R can be obtained by the following equation: R=B+A/2+C.

Next, a correction flow rate is calculated based on the actual flow rate calculated in the above-described manner. A calculation equation of a correction flow rate is obtained in the following manner. Here, a lower limit of control pressure at altitude (reference pressure) is defined as PL, a measured pressure (pressure when atmospheric pressure is varied) is defined as P, a total actual flow rate (gas supplied through the correcting mass flow controller 34 is not included) before correction is defined as R, a total actual flow rate after correction (gas supplied through the correcting mass flow controller 34 is included) is defined as R', a total actual flow rate of oxidizing gas is defined as Ox, and a correction flow rate is defined as X. In this case, even when the atmospheric pressure is varied, it is necessary to satisfy the following equation for keeping the partial pressure of oxidizing gas in the reaction tube 11 constant.

$PL*Ox/R=P*Ox/R'$ that is, $PL/R=P/R'$ here, since a correction flow rate X is expressed as X=R'−R, $X=R*(P/PL-1)$.

In accordance with this equation, a correction flow rate is calculated.

In the above equations, "*" and "/" respectively indicate multiplication and division.

Relations between flow rates of oxygen gas, hydrogen gas, dilution Ar gas, and a correcting Ar gas, atmospheric pressure, and partial pressure of oxidizing gas, i.e., oxygen and water vapor (moisture) when corrections are not carried out and when corrections are carried out in the embodiment 1 will be shown below.

Figure 4:
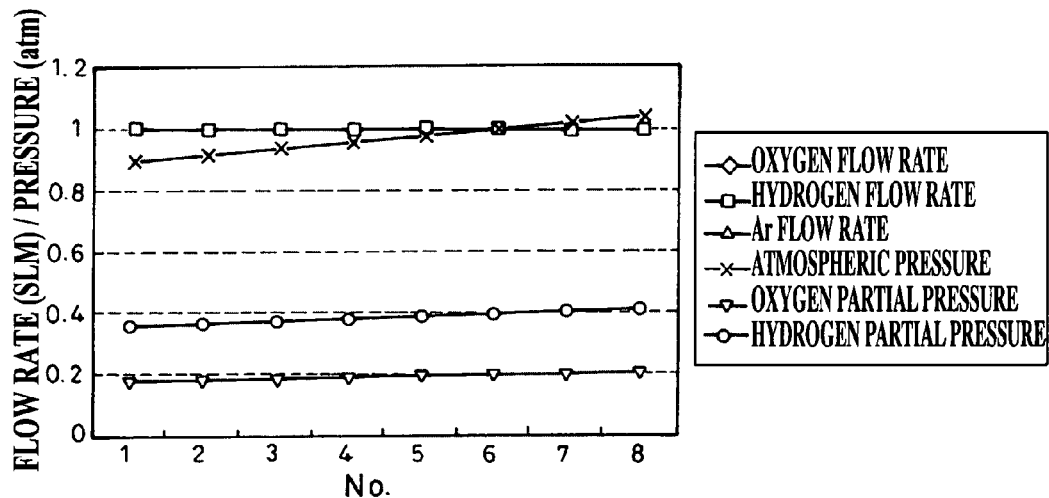
FIG. 4 is a diagram showing a relation between atmospheric pressure and partial pressure when correction is not carried out.
Figure 5:
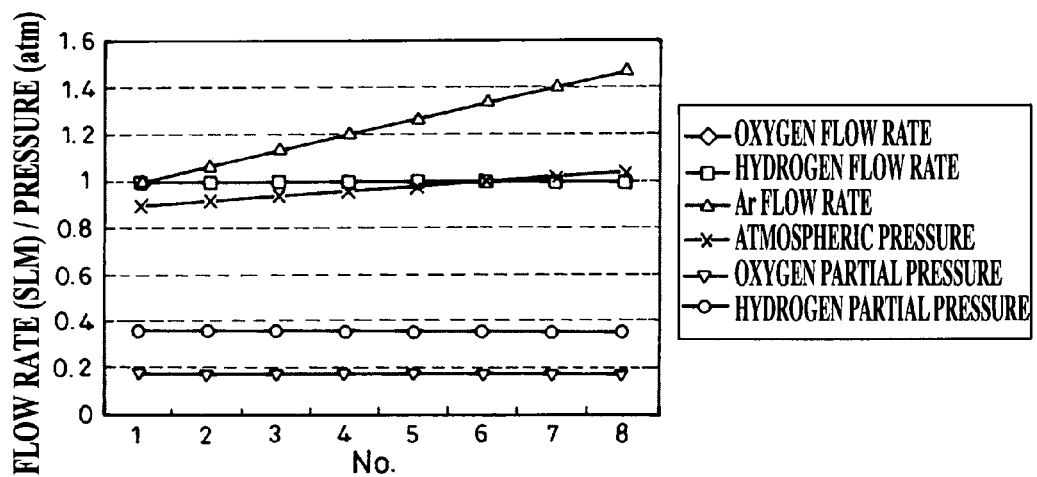
FIG. 5 is a diagram showing a relation between atmospheric pressure and partial pressure when a correction calculated from a set flow rate is carried out.
Figure 6:
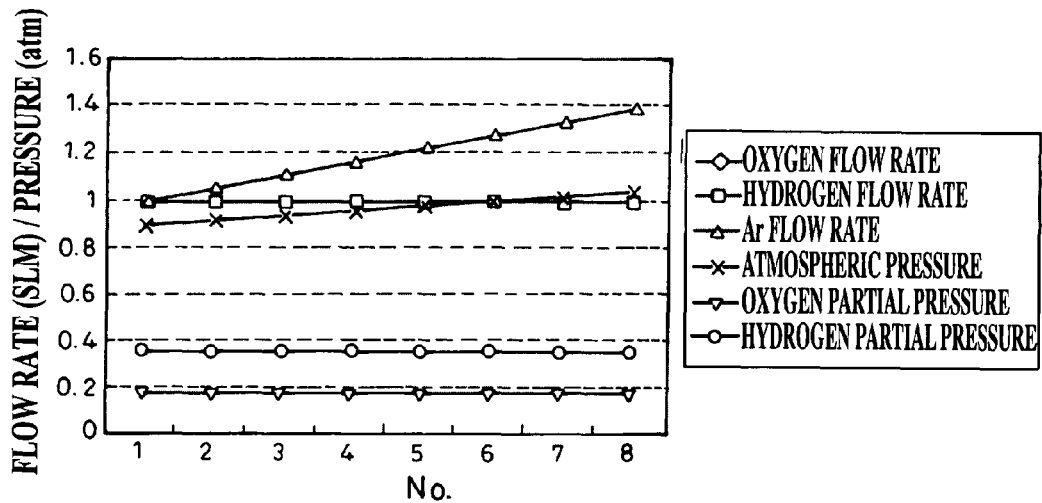
FIG. 6 is a diagram showing a relation between atmospheric pressure and partial pressure when a correction in which a gas reaction is taken into account is carried out.
Figure 7:
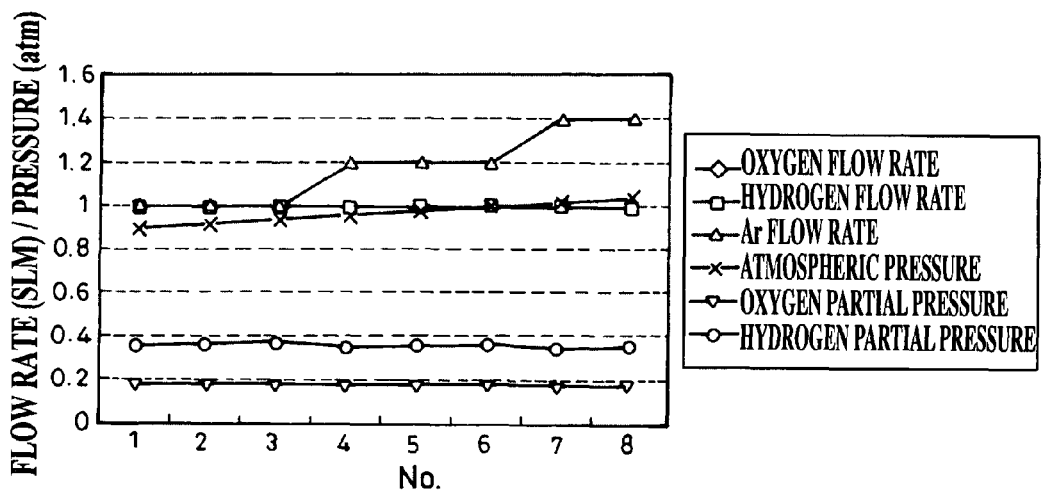
FIG. 7 is a diagram showing a relation between atmospheric pressure and partial pressure when resolving power of a flow rate is poor.

Table 1 and FIG. 4 show relations between flow rates of gases, atmospheric pressure, oxygen partial pressure, moisture partial pressure when no correction is carried out. Table 2 and FIG. 5 show relations between flow rates of gases, atmospheric pressure, oxygen partial pressure and moisture partial pressure when correction calculated from the set flow rates is carried out and correction in which reaction of gas is taken into account is not carried out. Table 3 and FIG. 6 show relations between flow rates of gases, atmospheric pressure, oxygen partial pressure and moisture partial pressure when correction in which reaction of gas is taken into account is carried out. Table 4 and FIG. 7 show relations between flow rates of gases, atmospheric pressure, oxygen partial pressure and moisture partial pressure when resolving power of the flow rate is poor. In Tables 1 to 4, a flow rate of Ar gas is divided into a flow rate of dilution Ar gas and a flow rate of correcting Ar gas, but in FIGS. 4 to 7, the flow rate of Ar gas is shown as a total flow rate of a flow rate of the dilution Ar gas and a flow rate of correcting Ar gas. In FIG. 4, the Ar flow rate and oxygen flow rate are superposed on the hydrogen flow rate, and in FIGS. 5 to 7, the oxygen flow rate is superposed on a hydrogen flow rate. In FIGS. 4 to 7, the lateral axis No. shows Nos. in Tables 1 to 4, and a vertical axis shows both a flow rate (SLM) and pressure (atm).

TABLE 1

Relation between atmospheric pressure and partial pressure when no correction is carried out

| No. | Flow rate of oxygen (SLM) | Flow rate of hydrogen (SLM) | Flow rate of dilution Ar (SLM) | Flow rate of correcting Ar (SLM) |
|---|---|---|---|---|
| 1 | 1 | 1 | 1 | 0 |
| 2 | 1 | 1 | 1 | 0 |
| 3 | 1 | 1 | 1 | 0 |
| 4 | 1 | 1 | 1 | 0 |
| 5 | 1 | 1 | 1 | 0 |
| 6 | 1 | 1 | 1 | 0 |
| 7 | 1 | 1 | 1 | 0 |
| 8 | 1 | 1 | 1 | 0 |

| No. | Atmospheric pressure (atm) | Oxygen partial pressure (atm) | Moisture partial pressure (atm) |
|---|---|---|---|
| 1 | 0.9 | 0.18 | 0.36 |
| 2 | 0.92 | 0.184 | 0.368 |
| 3 | 0.94 | 0.188 | 0.376 |

TABLE 1-continued

Relation between atmospheric pressure and partial pressure when no correction is carried out

| | | | |
|---|---|---|---|
| 4 | 0.96 | 0.192 | 0.384 |
| 5 | 0.98 | 0.196 | 0.392 |
| 6 | 1 | 0.2 | 0.4 |
| 7 | 1.02 | 0.204 | 0.408 |
| 8 | 1.04 | 0.208 | 0.416 |

TABLE 2

Relation between atmospheric pressure and partial pressure when correction calculated from set flow rate is carried out

| No. | Flow rate of oxygen (SLM) | Flow rate of hydrogen (SLM) | Flow rate of dilution Ar (SLM) | Flow rate of correcting Ar (SLM) |
|---|---|---|---|---|
| 1 | 1 | 1 | 1 | 0 |
| 2 | 1 | 1 | 1 | 0.066667 |
| 3 | 1 | 1 | 1 | 0.133333 |
| 4 | 1 | 1 | 1 | 0.2 |
| 5 | 1 | 1 | 1 | 0.266667 |
| 6 | 1 | 1 | 1 | 0.333333 |
| 7 | 1 | 1 | 1 | 0.4 |
| 8 | 1 | 1 | 1 | 0.466667 |

| No. | Atmospheric pressure (atm) | Oxygen partial pressure (atm) | Moisture partial pressure (atm) |
|---|---|---|---|
| 1 | 0.9 | 0.18 | 0.36 |
| 2 | 0.92 | 0.179221 | 0.358442 |
| 3 | 0.94 | 0.178481 | 0.356962 |
| 4 | 0.96 | 0.177778 | 0.355556 |
| 5 | 0.98 | 0.177108 | 0.354217 |
| 6 | 1 | 0.176471 | 0.352941 |
| 7 | 1.02 | 0.175862 | 0.351724 |
| 8 | 1.04 | 0.175281 | 0.350562 |

TABLE 3

Relation between atmospheric pressure and partial pressure when correction in which reaction of gas is taken into account is carried out

| No. | Flow rate of oxygen (SLM) | Flow rate of hydrogen (SLM) | Flow rate of dilution Ar (SLM) | Flow rate of correcting Ar (SLM) |
|---|---|---|---|---|
| 1 | 1 | 1 | 1 | 0 |
| 2 | 1 | 1 | 1 | 0.055556 |
| 3 | 1 | 1 | 1 | 0.111111 |
| 4 | 1 | 1 | 1 | 0.166667 |
| 5 | 1 | 1 | 1 | 0.222222 |
| 6 | 1 | 1 | 1 | 0.277778 |
| 7 | 1 | 1 | 1 | 0.333333 |
| 8 | 1 | 1 | 1 | 0.388889 |

| No. | Atmospheric pressure (atm) | Oxygen partial pressure (atm) | Moisture partial pressure (atm) |
|---|---|---|---|
| 1 | 0.9 | 0.18 | 0.36 |
| 2 | 0.92 | 0.18 | 0.36 |
| 3 | 0.94 | 0.18 | 0.36 |
| 4 | 0.96 | 0.18 | 0.36 |
| 5 | 0.98 | 0.18 | 0.36 |
| 6 | 1 | 0.18 | 0.36 |
| 7 | 1.02 | 0.18 | 0.36 |
| 8 | 1.04 | 0.18 | 0.36 |

TABLE 4

Relation between atmospheric pressure and partial pressure when resolving power of flow rate is poor

| No. | Flow rate of oxygen (SLM) | Flow rate of hydrogen (SLM) | Flow rate of dilution Ar (SLM) | Flow rate of correcting Ar (SLM) |
|---|---|---|---|---|
| 1 | 1 | 1 | 1 | 0 |
| 2 | 1 | 1 | 1 | 0 |
| 3 | 1 | 1 | 1 | 0 |
| 4 | 1 | 1 | 1 | 0.2 |
| 5 | 1 | 1 | 1 | 0.2 |
| 6 | 1 | 1 | 1 | 0.2 |
| 7 | 1 | 1 | 1 | 0.4 |
| 8 | 1 | 1 | 1 | 0.4 |

| No. | Atmospheric pressure (atm) | Oxygen partial pressure (atm) | Moisture partial pressure (atm) |
|---|---|---|---|
| 1 | 0.9 | 0.18 | 0.36 |
| 2 | 0.92 | 0.184 | 0.368 |
| 3 | 0.94 | 0.188 | 0.376 |
| 4 | 0.96 | 0.177778 | 0.355556 |
| 5 | 0.98 | 0.181481 | 0.362963 |
| 6 | 1 | 0.185185 | 0.37037 |
| 7 | 1.02 | 0.175862 | 0.351724 |
| 8 | 1.04 | 0.17931 | 0.358621 |

It can be found from the Tables that when correction calculated from a set flow rate is carried out and correction in which reaction of gas is taken into account is not carried out, partial pressure of oxidizing gas (oxygen and moisture) does not become constant and the partial pressure is varied, but when correction in which reaction of gas is taken into account is carried out, the partial pressure of oxidizing gas becomes constant. When resolving power of the flow rate is poor, it is found that it is difficult control the partial pressure constant.

It is preferable that variation in atmospheric pressure in each of the embodiments 1 to 3 is corrected in real time. If the variation is corrected in real time, even when the atmospheric pressure is varied during oxidizing processing, the partial pressure of oxidizing gas can be held constant and variation in oxide film thickness can be suppressed. If correction is carried out in accordance with atmospheric pressure when oxidizing processing is started, it is not possible to handle when atmospheric pressure is varied during the oxidizing processing.

It is conceived that the atmospheric pressure is usually varied only on a several hours basis. Thus, when the oxidizing processing is completed within time shorter than several hours, the possibility that the atmospheric pressure is varied during the oxidizing processing is low, and the correction necessity in real time is not so high.

In the case of annealing under oxygen atmosphere in a producing step of SIMOX (Separation by Implanted Oxygen) wafer that is one kind of SOI (Silicon On Insulator) wafer, however, the processing time is much longer than several hours, and may exceed ten hours in some cases. When processing having relatively long processing time is to be carried out, correction in real time is effective.

[Embodiment 4]

Figure 8:
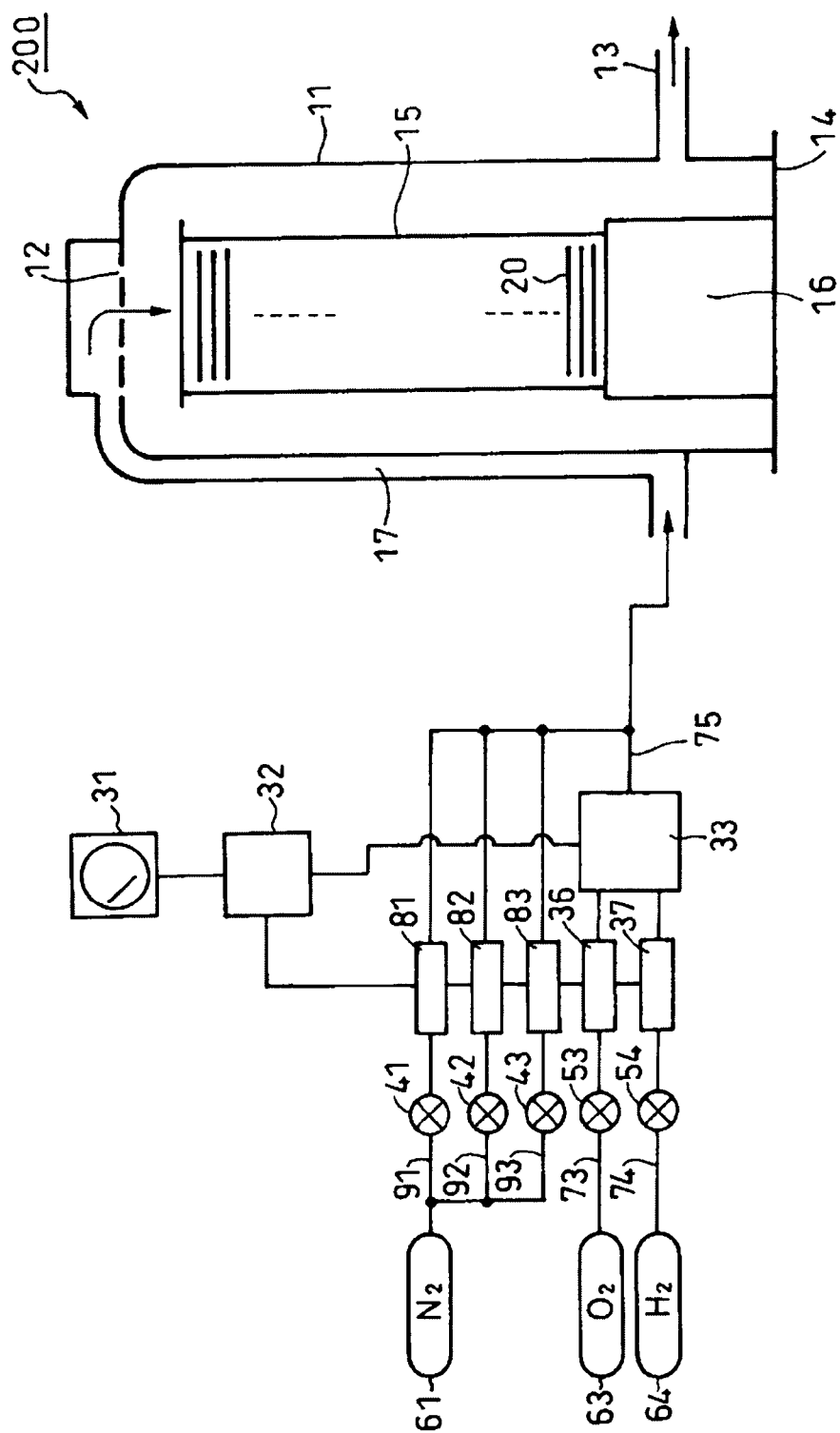
FIG. 8 is a schematic vertical sectional view for explaining a substrate processing apparatus according to an embodiment 4 of the invention.
Figure 9:
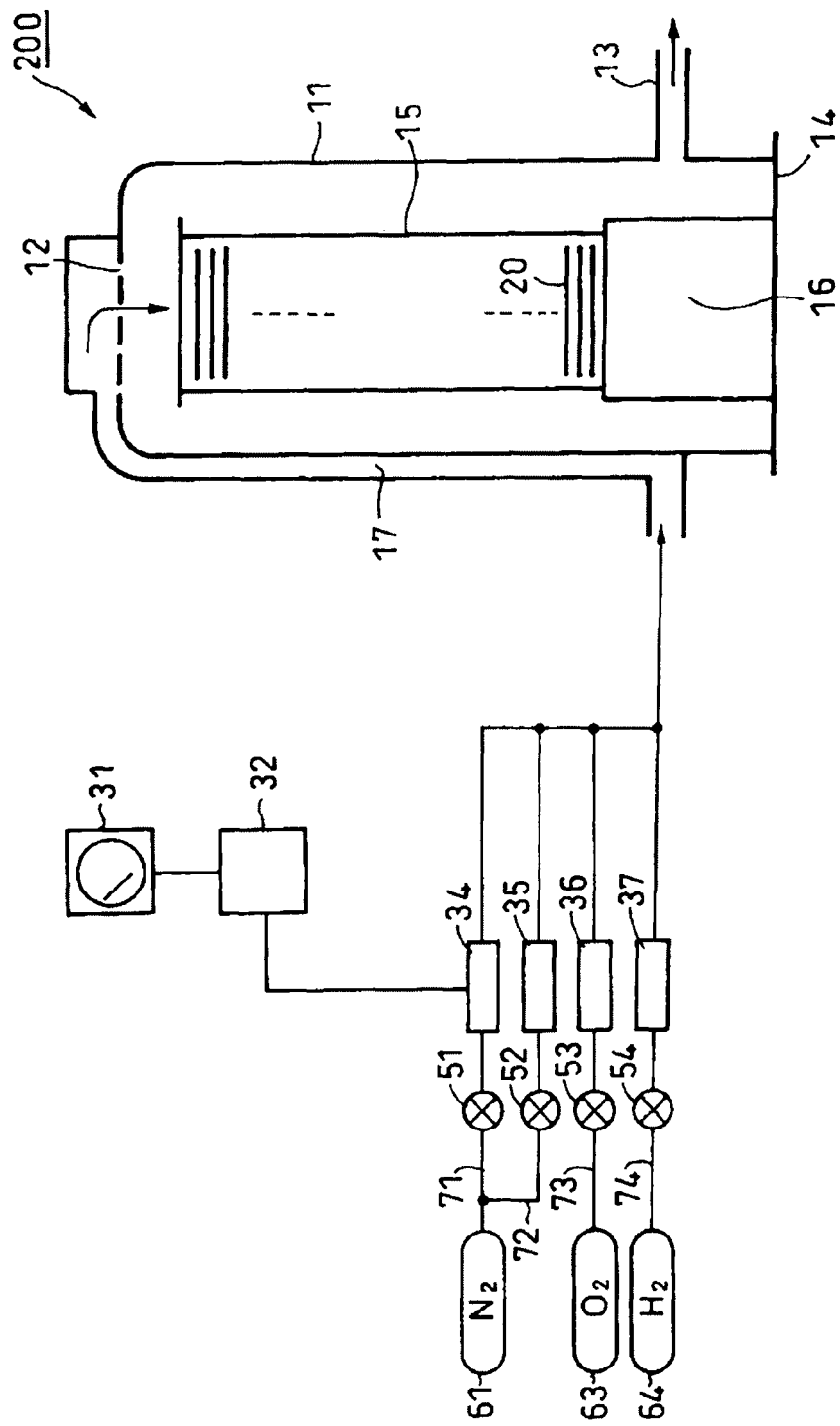
FIG. 9 is a schematic vertical sectional view for explaining a substrate processing apparatus according to an embodiment 5 of the invention.

The number of inert gas supply lines in the embodiment 1 is two, i.e., the inert gas supply lines 71 and 72, but in the embodiment 4 shown in FIG. 8, number of inert gas supply lines is three, i.e., a first inert gas supply line 91, a second inert gas supply line 92 and a third inert gas supply line 93, and other portions are the same as those of the embodiment 1.

The first inert gas supply line 91 includes a valve 41 and a mass flow controller 81. The second inert gas supply line 92 includes a valve 42 and a mass flow controller 82. The third inert gas supply line 93 includes a valve 43 and a mass flow controller 83. The first inert gas supply line 91, the second inert gas supply line 92 and the third inert gas supply line 93 are connected to a nitrogen gas source 61. The mass flow controllers 81 to 83 are connected to a controller 32, and are controlled by the controller 32.

The full scale of the mass flow controller 81 is the smallest, the full scale of the mass flow controller 82 is greater than that of the mass flow controller 81, the full scale of the mass flow controller 83 is greater than that of the mass flow controller 82, and the full scale of the mass flow controller 83 is the greatest.

The number of inert gas supply lines may be three as in this embodiment.

The mass flow controllers 81 to 83 may be used in the following combination.

(1) The mass flow controller 81 having the smallest full scale is used for correcting the partial pressure to be varied in accordance with variation in atmospheric pressure, the mass flow controller 82 having medium full scale and the mass flow controller 83 having the greatest full scale are controlled such that flow rates of inert gas become constant.

(2) The mass flow controller 81 having the smallest full scale is used for correcting a partial pressure varied by variation in the atmospheric pressure, the mass flow controller 82 having the medium full scale is controlled such that the flow rate of inert gas becomes constant, and the mass flow controller 83 having the greatest full scale is controlled such that the flow rate of inert gas becomes zero.

(3) The flow rate of the mass flow controller 81 having the smallest full scale is used for correcting a partial pressure varied by variation in atmospheric pressure, the mass flow controller 82 having the medium full scale is controlled such that the flow rate of inert gas becomes zero, and the mass flow controller 83 having the greatest full scale is controlled such that the flow rate of inert gas becomes constant.

(4) The mass flow controller 81 having the smallest full scale is controlled such that the flow rate of inert gas becomes zero, the mass flow controller 82 having the medium full scale is used for correcting a partial pressure varied by variation in atmospheric pressure, and the mass flow controller 83 having the greatest full scale is controlled such that a flow rate of inert gas becomes constant.

(5) The mass flow controller 81 having the smallest full scale and the mass flow controller 82 having the medium full scale are used for correcting a partial pressure varied by variation in atmospheric pressure, and the mass flow controller 83 having the greatest full scale is controlled such that a flow rate of inert gas becomes constant.

[Embodiment 5]

In this embodiment, the external combustion device 33 of the embodiment 1 is omitted, oxygen gas and hydrogen gas are supplied directly into the reaction tube 11, and both gases react with each other in the reaction tube 11. It is also possible to employ such a configuration. In this embodiment, the nitrogen gas source 61 is commonly used for the oxidizing gas partial pressure correcting nitrogen gas supply line 71 and the dilution/purge nitrogen gas supply line 72.

The substrate processing apparatus of the present invention is also applied to a producing step of a substrate.

An example in which a thermal processing apparatus is applied to one step of producing steps of the SIMOX wafer will be explained.

Oxygen ion is implanted into a single-crystal silicon wafer by an ion implantation device or the like.

Then, a wafer in which oxygen ion is implanted is annealed at a high temperature of 1300 to 1400° C., e.g., about 1350° C. or higher in Ar, $O_2$ atmosphere using a thermal processing apparatus of the present invention. At the time of annealing, DCE ($SiH_2Cl_2$) is introduced together with Ar, $O_2$ in some cases. With the processing, an SIMOX wafer in which an $SiO_2$ layer is formed (embedded) in the wafer is formed.

In addition to the SIMOX wafer, it is also possible to apply the thermal processing apparatus of the invention to one step of producing steps of a hydrogen anneal wafer. In this case, a wafer is annealed at a high temperature of about 1200° C. or higher in hydrogen atmosphere using the thermal processing apparatus of the invention. With this, crystal defect of a wafer surface layer on which an IC (integrated circuit) is formed can be reduced, and completeness can be enhanced. The thermal processing apparatus of the invention can also be applied to one step of producing steps of an epitaxial wafer.

Even when the high temperature annealing processing is carried out as one step of producing steps of a substrate, the thermal processing apparatus of the invention can preferably be applied.

The thermal processing apparatus of the invention can also be applied to a thermal processing step as one step of producing steps of a semiconductor device.

Especially, it is preferable that the thermal processing apparatus of the present invention is applied to a thermal processing step carried out at a relatively high temperature, e.g., wet oxidizing, dry oxidizing, hydrogen combustion oxidizing (pyrogenic oxidizing), a thermal oxidizing step such as HCl oxidizing, and a thermal dispersion step in which a semiconductor film is doped with impurities such as boron (B), phosphorus (P), arsenic (As) and antimony (Sb). DCE ($SiH_2Cl_2$) is introduced together with oxidizing gas in the thermal oxidizing step in some cases.

Also when a thermal processing step is carried out as one step of producing steps of a semiconductor device, the thermal processing apparatus of the present invention can suitably be applied.

The entire disclosures of Japanese Patent Application No. 2005-101275 filed on Mar. 31, 2005 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, the preferred embodiments of the present invention provides a producing method of a semiconductor device, a producing method of a substrate and a substrate processing apparatus capable of processing a substrate while more precisely controlling a partial pressure of oxidizing gas even when the atmospheric pressure is varied when a plurality of kinds of gases which react with each other are used to carry out oxidizing.

As a result, the invention can suitably be utilized for a producing method of a semiconductor device, a producing method of a substrate and a semiconductor wafer processing apparatus having a step for oxidizing a semiconductor wafer.

The invention claimed is:

1. A producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain, and wherein the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

2. A producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain, and wherein the flow rate of the inert gas is controlled by a plurality of flow rate control devices having different full scales to supply the inert gas into the reaction tube, at least one of the flow rate control devices controls a flow rate of the inert gas such that the flow rate is kept constant, and a flow rate control device having the smallest full scale controls a flow rate of the inert gas such that the flow rate is varied in accordance with the variation of the atmospheric pressure.

3. A producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain, and wherein the flow rate of the inert gas is controlled by two flow rate control devices having different full scales to supply the inert gas into the reaction tube, one of the two flow rate control devices having a greater full scale controls a flow rate of the inert gas such that the flow rate is kept constant, and the other of the two flow rate control devices having a smaller full scale controls a flow rate of the inert gas such that the flow rate is varied in accordance with the variation of the atmospheric pressure.

4. A producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain, and wherein the flow rate of the inert gas is controlled by a plurality of flow rate control devices to supply the inert gas into the reaction tube, at least one of the flow rate control devices controls a flow rate of the inert gas such that the flow rate is kept constant, and at least another of the flow rate control devices controls a flow rate of the inert gas such that the flow rate is varied in accordance with the variation of the atmospheric pressure.

5. A producing method of a semiconductor device, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain, and wherein the plurality of kinds of gases which react with each other are $O_2$ gas and $C_2H_2Cl_2$ gas, and these gases are supplied directly into the reaction tube.

6. A producing method of a substrate, comprising:

loading a substrate into a reaction tube;

oxidizing the substrate under an atmospheric pressure by supplying a plurality of kinds of gases which react with each other and an inert gas into the reaction tube; and unloading, from the reaction tube, the substrate after the oxidizing, wherein in the oxidizing, a flow rate of the inert gas is varied in accordance with a variation of the atmospheric pressure to keep constant a partial pressure of an oxidizing gas or partial pressures of oxidizing gases in the reaction tube, and the flow rate of the inert gas is calculated based on a pre-calculated flow rate of a gas or pre-calculated flow rates of gases produced by reaction of the plurality of gases and a pre-calculated flow rate of a gas which is not consumed by the reaction and which remains or pre-calculated flow rates of gases which are not consumed by the reaction and which remain, and wherein the plurality of kinds of gases which react with each other are $O_2$ gas and $C_2H_2Cl_2$ gas, and these gases are supplied directly into the reaction tube.

7. A producing method of a substrate, comprising:
a step of loading a substrate into a reaction tube;
a step of oxidizing the substrate under an atmospheric pressure by supplying a processing gas or processing gases and an inert gas into the reaction tube; and
a step of unloading, from the reaction tube, the substrate after the oxidizing, wherein
in the oxidizing step, a flow rate of the inert gas is varied in accordance with a variation of the atmospheric pressure to keep constant a partial pressure of an oxidizing gas or partial pressures of oxidizing gases in the reaction tube, the flow rate of the inert gas is controlled by a plurality of flow rate control devices having different full scales to supply the inert gas into the reaction tube, at least one of the flow rate control devices controls a flow rate of the inert gas such that the flow rate is kept constant, and at least another of the flow rate control devices having a smaller full scale than the at least one of the flow rate control devices controls a flow rate of the inert gas such that the flow rate is varied in accordance with the variation of the atmospheric pressure.

8. A substrate processing apparatus, comprising:
a reaction tube to oxidize a substrate under an atmospheric pressure;
a first gas supply system to supply $O_2$ gas as a first processing gas into the reaction tube;
a second gas supply system to supply $C_2H_2Cl_2$ gas as a second processing gas which is to react with the first processing gas into the reaction tube;
a third gas supply system to supply an inert gas into the reaction tube;
a flow rate control device which is provided in at least the third gas supply system and which controls a flow rate of the inert gas to be supplied into the reaction tube;
a pressure gage, provided outside the reaction tube, to detect a variation of the atmospheric pressure; and
a controller to control the flow rate of the inert gas to be supplied into the reaction tube such that the flow rate is varied to keep constant a partial pressure of an oxidizing gas or partial pressures of oxidizing gases in the reaction tube by the flow rate control device provided in the third gas supply system in accordance with a variation of the atmospheric pressure detected by the pressure gage when the substrate is oxidized, and the controller calculating the flow rate of the inert gas based on a pre-calculated flow rate of a gas or pre-calculated flow rates of gases produced by reaction between the $O_2$ gas as the first processing gas and the $C_2H_2Cl_2$ gas as the second processing gas and a pre-calculated flow rate of a gas which is not consumed by the reaction and which remains or pre-calculated flow rates of gases which are not consumed by the reaction and which remain.

9. A substrate processing apparatus, comprising:
a reaction tube to oxidize a substrate under an atmospheric pressure;
a processing gas supply system to supply a processing gas or processing gases into the reaction tube;
a first inert gas supply system to supply an inert gas into the reaction tube;
a second inert gas supply system to supply the inert gas into the reaction tube;
a first flow rate control device, provided in the first inert gas supply system, to control a flow rate of the inert gas to be supplied into the reaction tube;
a second flow rate control device, provided in the second inert gas supply system, to control a flow rate of the inert gas to be supplied into the reaction tube, the second flow rate control device having a full scale different from that of the first flow rate control device;
a pressure gage, provided outside the reaction tube, to detect a variation of the atmospheric pressure; and
a controller to control a flow rate of the inert gas to be supplied into the reaction tube such that the flow rate is varied to keep constant a partial pressure of an oxidizing gas or partial pressures of oxidizing gases in the reaction tube in accordance with a variation of the atmospheric pressure detected by the pressure gage when the substrate is oxidized, the controller controlling the flow rate of the inert gas to keep the flow rate constant in the second flow rate control device and the flow rate of the inert gas to vary the flow rate in accordance with the variation of the atmospheric pressure in the first flow rate control device.

\* \* \* \* \*